(12) United States Patent
Guo

(10) Patent No.: US 8,791,709 B2
(45) Date of Patent: Jul. 29, 2014

(54) ON-CHIP MEASUREMENT OF CAPACITANCE FOR MICRO-ELECTRO-MECHANICAL SYSTEM (MEMS) ACTUATOR CIRCUIT

(75) Inventor: Dianbo Guo, Singapore (SG)

(73) Assignee: STMicroelectronics Asia Pacific Pte Ltd., Singapore (SG)

( * ) Notice: Subject to any disclaimer, the term of this patent is extended or adjusted under 35 U.S.C. 154(b) by 699 days.

(21) Appl. No.: 12/972,596

(22) Filed: Dec. 20, 2010

(65) Prior Publication Data
US 2012/0153973 A1 Jun. 21, 2012

(51) Int. Cl.
*G01R 27/26* (2006.01)

(52) U.S. Cl.
USPC .......................................................... 324/679

(58) Field of Classification Search
USPC .......................................................... 324/679
See application file for complete search history.

(56) References Cited

U.S. PATENT DOCUMENTS

| | | | |
|---|---|---|---|
| 5,421,193 A * | 6/1995 | Carlin et al. | 73/49.2 |
| 7,287,415 B2 * | 10/2007 | Borwick et al. | 73/54.01 |
| 7,301,330 B2 * | 11/2007 | Van Oevelen et al. | 324/207.21 |
| 2004/0227528 A1 * | 11/2004 | Eberlein | 324/679 |
| 2007/0171590 A1 * | 7/2007 | Nagata et al. | 361/93.1 |
| 2008/0100392 A1 * | 5/2008 | Pernia et al. | 331/173 |
| 2008/0123238 A1 * | 5/2008 | Campos et al. | 361/103 |
| 2008/0191795 A1 * | 8/2008 | Dharmalinggam et al. | 327/553 |

* cited by examiner

*Primary Examiner* — Jeff Natalini

(57) ABSTRACT

A micro-electro-mechanical system (MEMS) actuator circuit and method. The circuit includes a current mirror, a voltage divider having an interior contact and coupled between the mirror output and a potential, an operational amplifier having an input coupled to the interior contact and a switch having input/output contacts separately coupled to the amplifier output and the mirror input and having a switch control. The amplifier output can be coupled to a digital control circuit which can be coupled to the switch control contact and to a digital to analog circuit (DAC) which can be coupled to the digital control circuit and to another amplifier input. An enable signal at the switch control couples the switch input/output contacts together. The capacitance of a MEMS capacitor coupled to the mirror output is determined by measurement of time for the amplifier output to switch from one level to another following a change in DAC output potential.

16 Claims, 7 Drawing Sheets

ON-CHIP MEASUREMENT OF CAPACITANCE FOR MICRO-ELECTRO-MECHANICAL SYSTEM (MEMS) ACTUATOR CIRCUIT

BACKGROUND

Micro-electro-mechanical-systems (MEMS) technology is used in some digital cameras to fabricate moving mechanical structures with less than 1 micron tolerance. This technology provides alignment accuracies required for high performance digital cameras. In particular embodiments, a MEMS fabricated capacitor includes two conducting plates whose spacing varies as the potential between two plates is changed which in turn adjusts the capacitance of the MEMS capacitor. If the optical lens of a camera is connected to one plate of MEMS capacitor and the other plate is fixed. the focal plane of the camera can be moved closer to the camera as the potential across the MEMS cell is increased.

In general, the capacitance of a MEM capacitor versus the applied potential is measured individually for each MEM capacitor as a part of the production process. This data is then stored in a memory cell for each individual camera to define the focus range. The associated requirement for expensive off-chip equipment and test time significantly adds to product cost.

BRIEF DESCRIPTION OF THE DRAWINGS

The accompanying drawings provide visual representations which will be used to more fully describe various representative embodiments and can be used by those skilled in the art to better understand the representative embodiments disclosed herein and their inherent advantages. In these drawings, like reference numerals identify corresponding elements.

DETAILED DESCRIPTION

Figure 1:
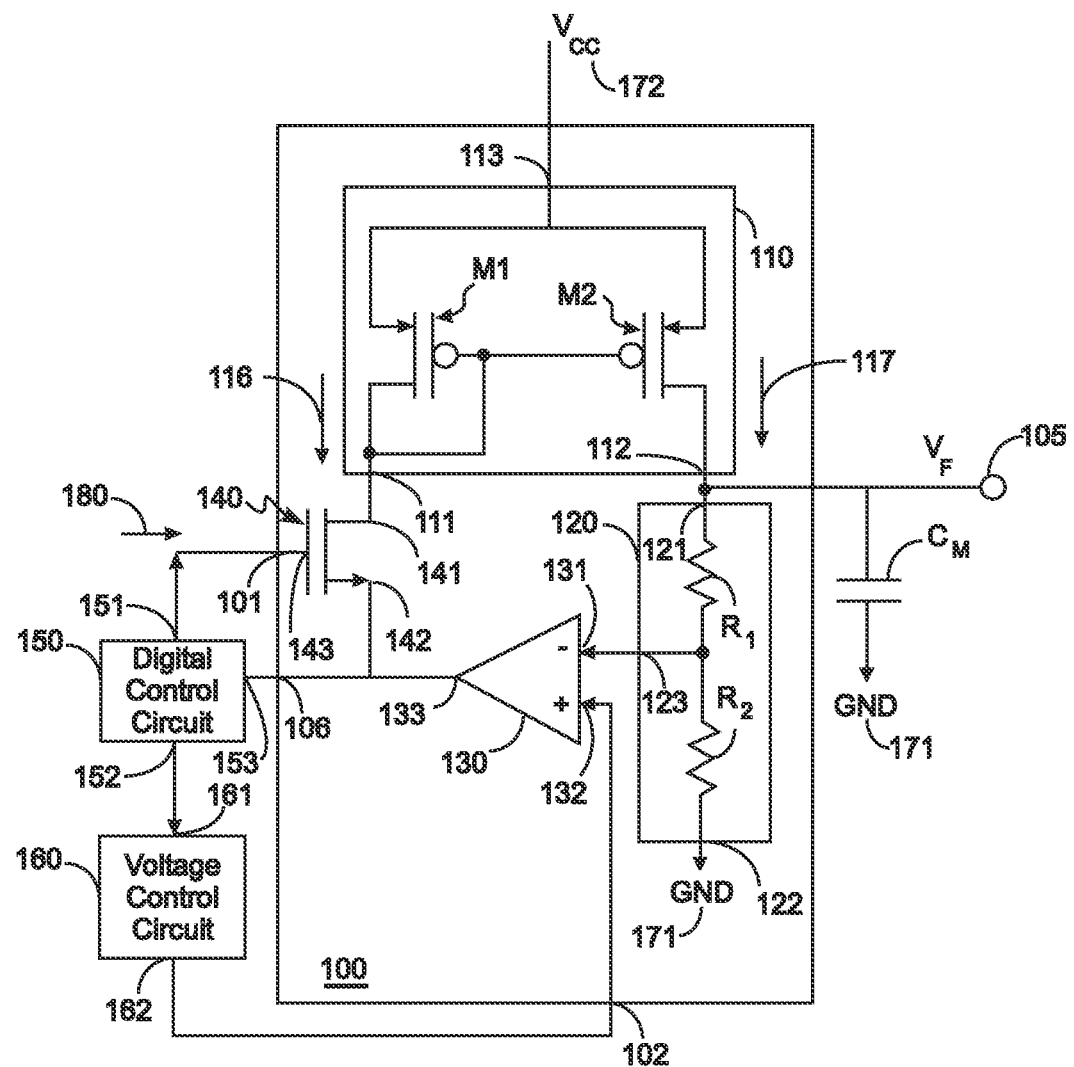
FIG. 1 is a drawing of a circuit diagram of a micro-electromechanical system (MEMS) actuator circuit as described in various representative embodiments.

As shown in the drawings for purposes of illustration, a new MEMS actuator circuit capable of both driving a MEMS capacitor to a preselected potential and of measuring the capacitance of the MEMS capacitor at that preselected potential, as well as an associated method for using that circuit to perform such a measurement are disclosed herein. In the driver mode, the MEMS actuator circuit charges the MEMS capacitor to a preselected focal potential. In a representative embodiment, an operational amplifier serves as a comparator in detecting the time to discharge the MEMS capacitor to a smaller potential through a voltage divider. The discharge time, the resistances of the resistors in the voltage divider, and the potential to which the MEMS capacitor is pre-charged can be used to calculate the MEMS cell capacitance for that pre-charged potential on-chip without an external test setup. Using a MEMS actuator circuit and method disclosed herein, it is no longer necessary to measure the voltage/capacitance characteristics of the MEMS capacitor via a separate setup during production and to store the results of those measurements for each individual digital camera or other device that is dependent upon the voltage/capacitance characteristics of the MEMS capacitor as has been necessary in past implementations. The MEMS actuator circuit can now perform the on-chip capacitance measurement and then automatically adjust the focal range.

While the present invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the following description and in the several figures of the drawings, like reference numerals are used to describe the same, similar or corresponding parts in the several views of the drawings.

FIG. 1 is a drawing of a circuit diagram of a micro-electromechanical system (MEMS) actuator circuit 100 as described in various representative embodiments. In the representative embodiment of FIG. 1, the MEMS actuator circuit 100 comprises a current mirror 110; a voltage divider 120, an operational amplifier 130, and a switch 140 which could be, for example, a field-effect transistor 140. The MEMS actuator circuit 100 has a first actuator input 101, a second actuator input 102, and a first actuator output 105. The current mirror 110 has a first mirror contact 111 also referred to herein as a mirror input 111, a second mirror contact 112 also referred to herein as a mirror output 112, and a third mirror contact 113; the voltage divider 120, has a first end contact 121, a second end contact 122, and an interior contact 123; the operational amplifier 130 has a first amplifier input 131, a second amplifier input 132, and an amplifier output 133; and the switch 140 has a first switch contact 141, a second switch contact 142, and a switch control contact 143.

Also shown in FIG. 1 is a digital control circuit 150, a voltage control circuit 160 which could be a digital to analog converter (DAC) 160 and a MEMS capacitor $C_M$. The digital control circuit 150 has a first control output 151, a second control output 152, and a control input 153; and the DAC 160 has a DAC input 161 and a DAC output 162.

In addition as shown in FIG. 1, the current mirror 110 could be, for example, comprised of a first field-effect transistor $M_1$ and a second field-effect transistor $M_2$. Also, as shown in FIG. 1, the voltage divider 120 could be, for example, comprised of a first resistor $R_1$ which could also be a first resistive element $R_1$ and a second resistor $R_2$ which could also be a second resistive element $R_2$. The field-effect transistor 140 is referred to herein as enabling field-effect transistor 140.

The third mirror contact 113 is coupled to a second potential 172 which in FIG. 1 is shown as $V_{CC}$; the first mirror contact 111 is coupled to the first switch contact 141; the first actuator output 105 is coupled to the second mirror contact 112 and to the first end contact 121; the second end contact 122 is coupled to a first potential 171 which in FIG. 1 is shown as ground potential GND; the interior contact 123 is coupled to the first amplifier input 131; the second actuator input 102 is coupled to the second amplifier input 132 and to the DAC output 162; the second actuator output 106 is coupled to the amplifier output 133, to the second switch contact 142, and to the control input 153; the first actuator input 101 is coupled to the switch control contact 143 and to the first control output 151; the second control output 152 is coupled to the DAC input 161; the first actuator output 105 is coupled to one end of the MEMS capacitor $C_M$; and the other end of the MEMS capacitor $C_M$ is coupled to the first potential 171.

In driver mode, the MEMS actuator circuit 100 charges the MEMS capacitor $C_M$ to a preselected focal potential $V_F$. The digital control circuit 150 sends an enabling signal 180 to the switch control contact 143 which turns on the enabling field-effect transistor 140 and also transmits instructions to the DAC 160 to place a value equal to $V_F \times R_1/(R_1+R_2)$ at the second amplifier input 132 which forces an input current through the current mirror 110 via the first and the third mirror contacts 111,113 resulting in an output current through the current mirror 110 via the second and the third mirror contacts 112,113 which forces the potential at the first amplifier input 131 to the same potential as the output of the DAC 160 at the DAC output 162 at which point the output current through the current mirror 110 reaches a steady state value and the potential at the first actuator output 105 reaches the preselected focal potential $V_F$ which results in the potential across the MEMS capacitor $C_M$ becoming the preselected focal potential $V_F$. During the driver mode, signal values at the control input 153 are ignored.

Operation of the MEMS actuator circuit 100 in a capacitor measurement mode will be explained in the discussion of the flow chart of FIG. 3A that follows.

Figure 2:
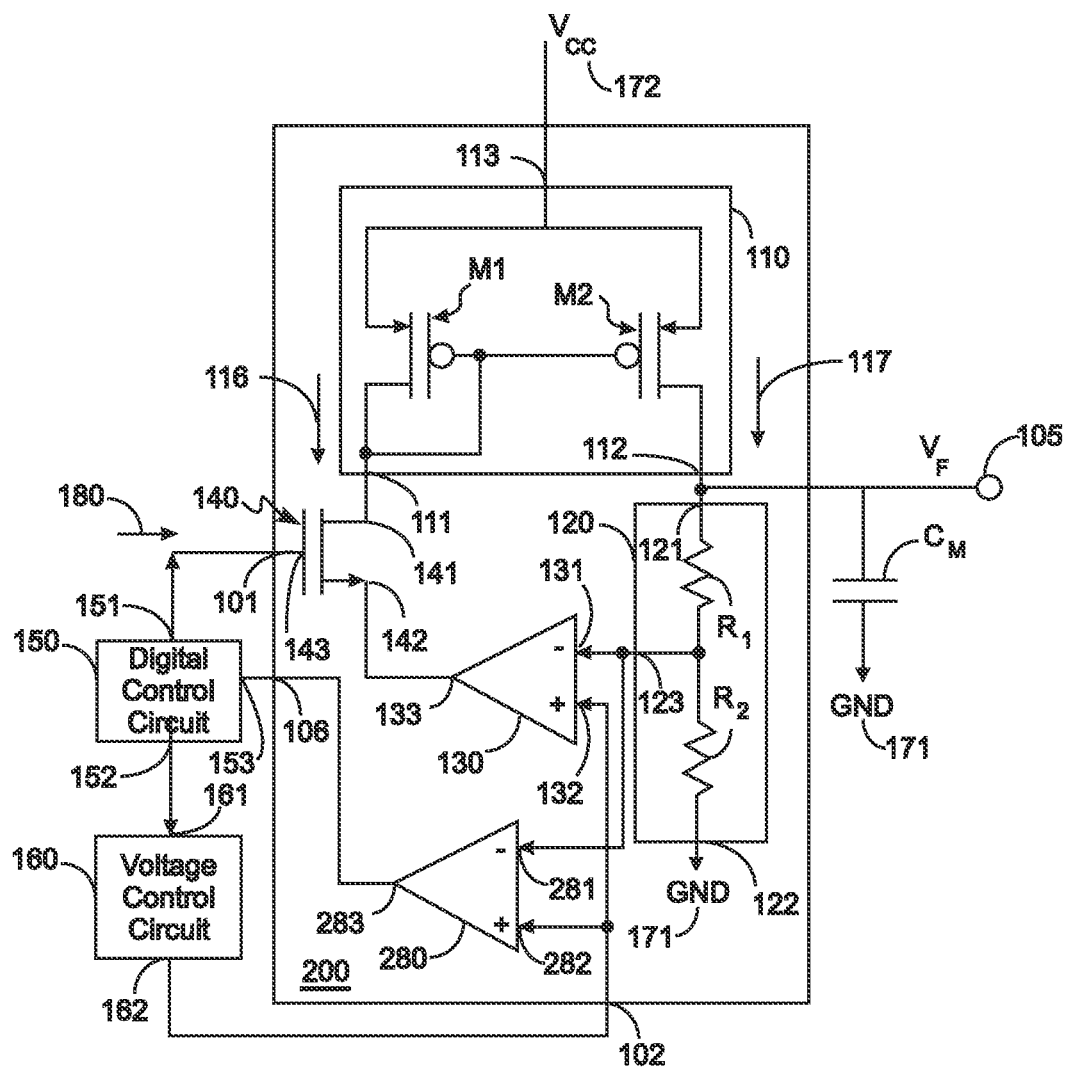
FIG. 2 is a drawing of a circuit diagram of another MEMS actuator circuit as described in various representative embodiments.

FIG. 2 is a drawing of a circuit diagram of another MEMS actuator circuit 200 as described in various representative embodiments. The MEMS actuator circuit 200 of FIG. 2 differs from that of FIG. 1 as follows: (1) the addition of a comparator 280 having a first comparator input 281, a second comparator input 282, and a comparator output 283, (2) the amplifier output 133 is now coupled only to the second switch contact 142 rather than also to the second actuator output 106 and the control input 153 as shown in FIG. 1, (3) the interior contact 123 of the voltage divider 120 shown coupled to the first amplifier input 131 in FIG. 1 is also coupled to the first comparator input 281 in FIG. 2, (4) the second actuator input 102 shown coupled to the second amplifier input 132 and to the DAC output 162 in FIG. 1 is also coupled to the second comparator input 282 in FIG. 2, and (5) the second actuator output 106 is coupled to the comparator output 283 and to the control input 153 in FIG. 2 rather than to the amplifier output 133, to the second switch contact 142, and to the control input 153 as shown in FIG. 1.

In driver mode, the MEMS actuator circuit 200 of FIG. 2 performs in a manner similar to that of the MEMS actuator circuit 200 of FIG. 1. The MEMS actuator circuit 200 charges the MEMS capacitor $C_M$ to a preselected focal potential $V_F$. The digital control circuit 150 sends an enabling signal 180 to the switch control contact 143 which turns on the enabling field-effect transistor 140 and also transmits instructions to the DAC 160 to place a value equal to $V_F \times R_1/(R_1+R_2)$ at the second amplifier input 132 which forces an input current through the current mirror 110 via the first and the third mirror contacts 111,113 resulting in an output current through the current mirror 110 via the second and the third mirror contacts 112,113 which forces the potential at the first amplifier input 131 to the same potential as the output of the DAC 160 at the DAC output 162 at which point the output current through the current mirror 110 reaches a steady state value and the potential at the first actuator output 105 reaches the preselected focal potential $V_F$ which results in the potential across the MEMS capacitor $C_M$ becoming the preselected focal potential $V_F$. During the driver mode, signal values at the control input 153 are ignored.

Operation of the other MEMS actuator circuit 200 of FIG. 2 in a capacitor measurement mode will be explained in the discussion of the flow chart of FIG. 3A that follows.

Figure 3A:
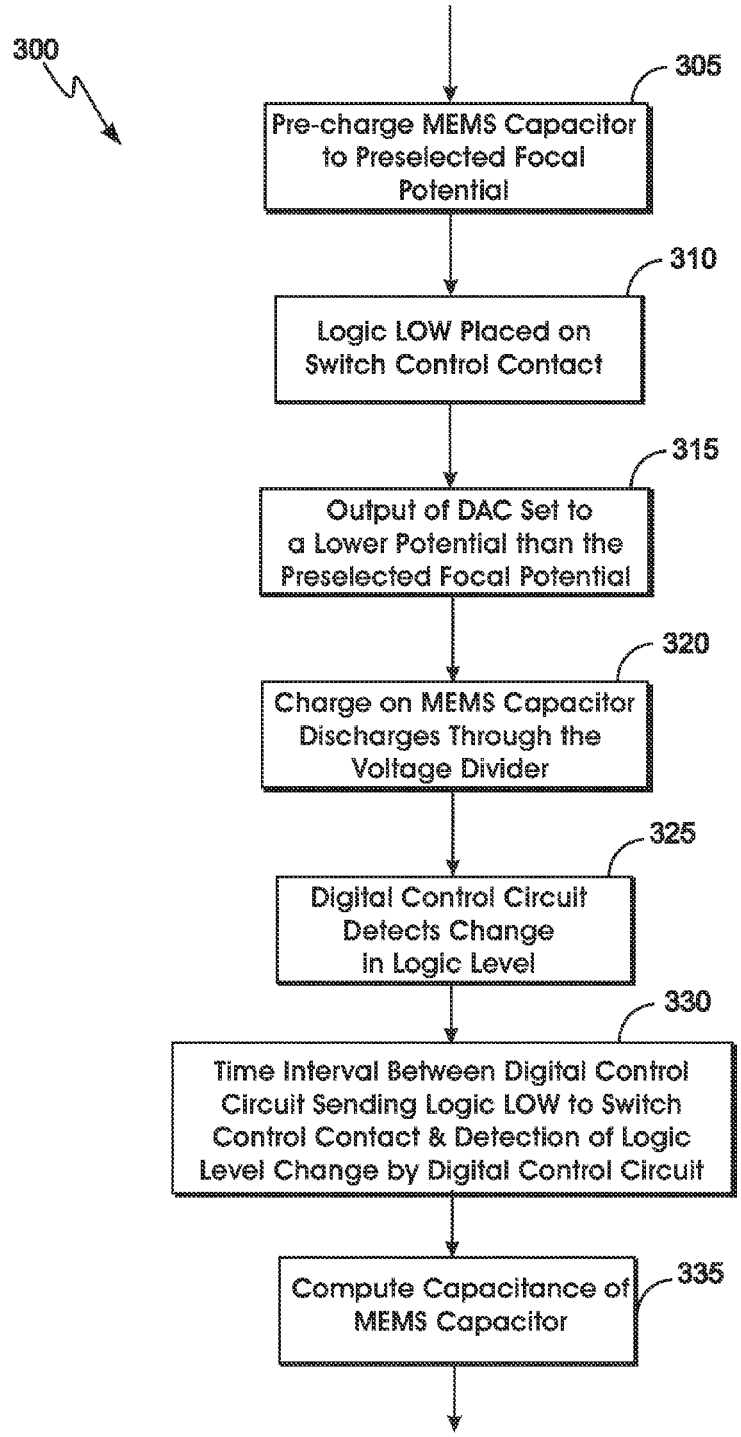
FIG. 3A is a drawing of a flow chart of a method for the on-chip measurement of the capacitance of a MEMS capacitor as described in various representative embodiments.

FIG. 3A is a drawing of a flow chart of a method 300 for the on-chip measurement of the capacitance of a MEMS capacitor $C_M$ as described in various representative embodiments. In block 305 of FIG. 3A, the MEMS actuator circuit 100 pre-charges the MEMS capacitor $C_M$ to a preselected focal potential $V_F$. This process could be accomplished using either the circuit of FIG. 1 or FIG. 2 as was described above. The voltage across the MEMS capacitor $C_M$ can be driven to the preselected focal potential $V_F$ by setting the output of the DAC 160 at the DAC output 162 to $V_F \times R_1/(R_1+R_2)$. Block 305 then transfers control to block 310.

In block 310, the MEMS actuator circuit 100 enters the capacitance measurement mode by the digital control circuit 150 placing a logic LOW on the switch control contact 143 thereby opening the first switch contact 141 from the second switch contact 142 which if the switch 140 is the n-channel field-effect transistor (FET) shown in FIGS. 1 and 2 turns the n-channel FET off. Block 310 then transfers control to block 315.

Simultaneously with the action in block 310, the digital control circuit 150 sets the output of the DAC 160 to a lower potential at the DAC output 162. This potential at the DAC output 162 could be one, two, or any other suitable number of bits lower than that of the preselected focal potential $V_F$ to which the MEMS capacitor $C_M$ was pre-charged. In the MEMS actuator circuit 100 of FIG. 1, the output of the operational amplifier 130 is thereby set to a logic LOW. In the MEMS actuator circuit 100 of FIG. 2, both the output of the operational amplifier 130 and the comparator 280 are thereby set to a logic LOW. Block 315 then transfers control to block 320.

In block 320, charge on the MEMS capacitor $C_M$ discharges through the voltage divider 120 for the representative embodiments of both FIG. 1 and FIG. 2. Block 320 then transfers control to block 325.

In block 325, for the embodiment of FIG. 1, when the potential of the first amplifier input 131 becomes lower than the potential set on the second amplifier input 132, the digital control circuit 150 at the control input 153 detects that the output of the operational amplifier 130 switched from the logic LOW state to a logic HIGH state, and for the embodiment of FIG. 2, when the potential of the first comparator input 281 becomes lower than the potential set on the second comparator input 282, the digital control circuit 150 at the control input 153 detects that the output of the comparator 280 switched from the logic LOW state to a logic HIGH state. Block 325 then transfers control to block 330.

In block 330, for the embodiments of both FIG. 1 and FIG. 2, the time interval T between the time that the digital control circuit 150 sent a logic LOW to the switch control contact 143 of the switch 140 and the time that digital control circuit 150 detects a change at the control input 153 from a logic LOW state to a logic HIGH state is measured using a high precision oscillator internal to the digital control circuit 150. Block 330 then transfers control to block 335.

In block 335, the capacitance of the MEMS capacitor $C_M$ is computed. The capacitance of the MEMS capacitor $C_M$ can be computed using Equation 1 or in the approximation of Equation 7 as found in the following discussion. Block 335 then terminates the process.

Figure 3B:
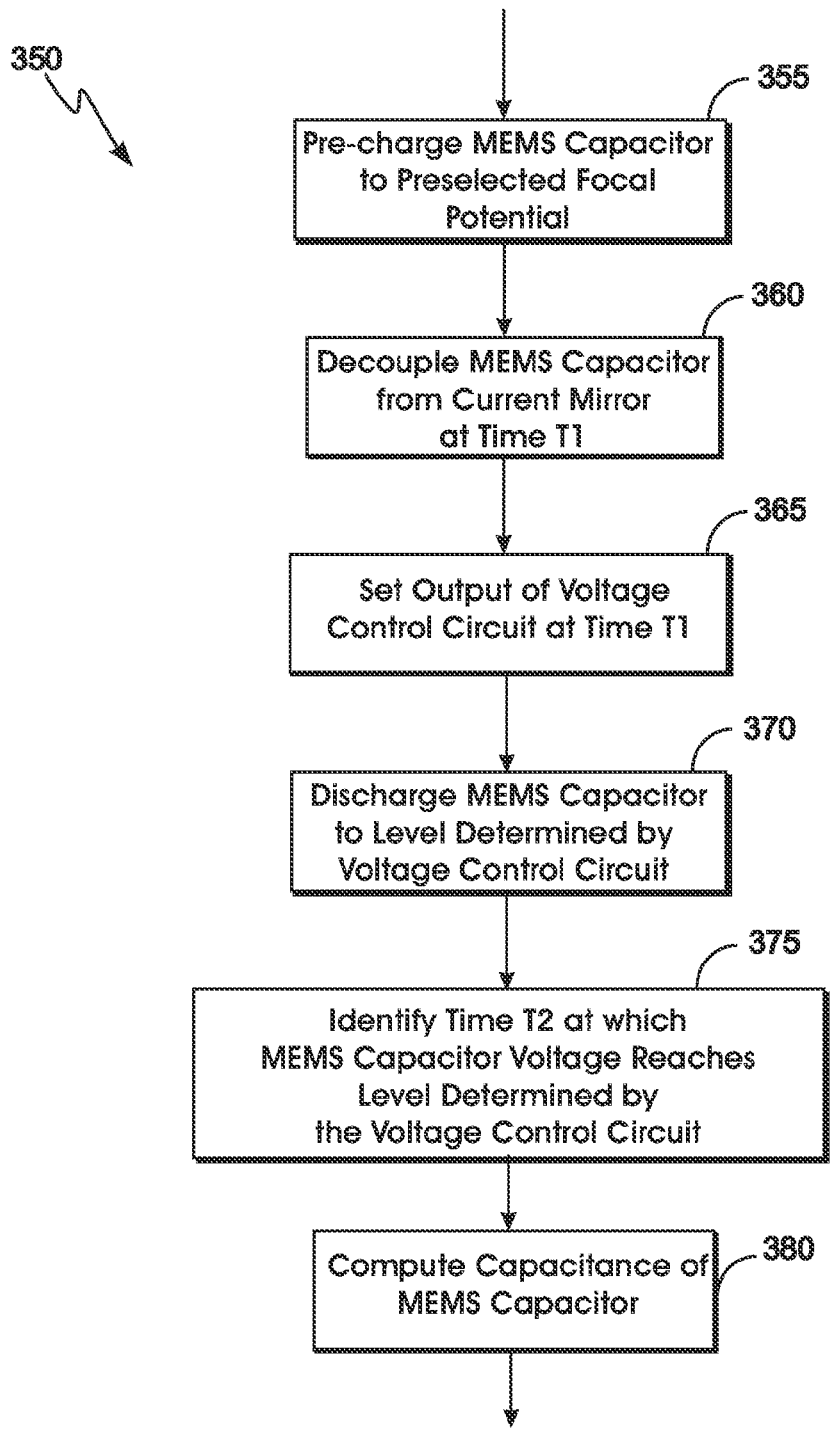
FIG. 3B is a drawing of a flow chart of another method for the on-chip measurement of the capacitance of a MEMS capacitor as described in various representative embodiments.

FIG. 3B is a drawing of a flow chart of another method 350 for the on-chip measurement of the capacitance of a MEMS capacitor $C_M$ as described in various representative embodiments. In block 355 of FIG. 3B, the MEMS actuator circuit 100 pre-charges the MEMS capacitor $C_M$ to a preselected focal potential $V_F$. This process could be accomplished using either the circuit of FIG. 1 or FIG. 2 as was described above. The voltage across the MEMS capacitor $C_M$ can be driven to the preselected focal potential $V_F$ by setting the output of the DAC 160 (voltage control circuit 160) at the DAC output 162 to $V_F \times R_1/(R_1+R_2)$. Block 355 then transfers control to block 360.

In block 360, the MEMS actuator circuit 100 enters the capacitance measurement mode at a first time $T_1$ by decoupling the capacitor $C_M$ from current from the current mirror 110 that pre-charged the capacitor $C_M$ to a preselected potential. Block 360 then transfers control to block 365.

Simultaneously with the action in block 360 at the first time $T_1$, in block 365 the output of a voltage control circuit 160 is set to a value associated with a smaller absolute potential across the capacitor $C_M$ than that of the preselected potential. Block 365 then transfers control to block 370.

In block 370, the capacitor $C_M$ is discharged through a voltage divider 120 until the value of the potential across the capacitor $C_M$ associated with the smaller absolute potential across the capacitor $C_M$ is reached. Block 370 then transfers control to block 375.

In block 375, the time at which the value of the potential across the capacitor $C_M$ associated with the smaller absolute potential across the capacitor $C_M$ is reached is identified as a second time $T_2$. Block 375 then transfers control to block 380.

In block 380, the capacitance of the capacitor $C_M$ is computed. The capacitance of the capacitor $C_M$ can be computed using the resistance of the voltage divider 120 and the difference between the second time $T_2$ and the first time $T_1$ as in Equation 1 or in the approximation of Equation 7 as found in the following discussion. Block 380 then terminates the process.

Figure 4:
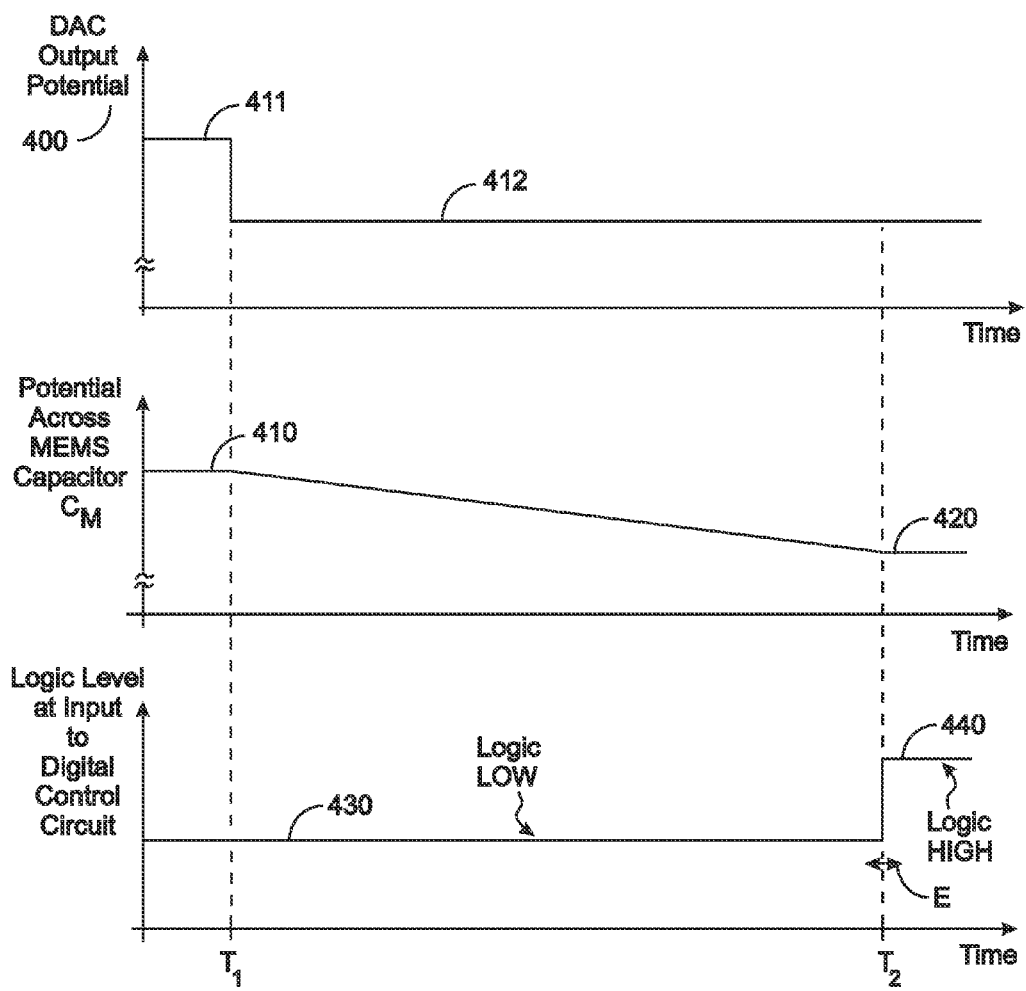
FIG. 4 is a composite drawing of plots of three operational potentials vs. time in the representative embodiments of FIGS. 1 and 2.

FIG. 4 is a composite drawing of plots of three operational potentials vs. time in the representative embodiments of FIGS. 1 and 2. The potentials shown in FIG. 4 are not to scale. The upper plot is a plot of the DAC output potential 400 (the potential at the DAC output 162) vs. time; the middle plot is a plot of the potential across the MEMS capacitor $C_M$ vs. time; and the lower plot is a plot of the logic level at the control input 153 of the digital control circuit 150.

Prior to the first time $T_1$, the MEMS capacitor $C_M$ has been charged to a predetermined potential determined by the potential of the DAC output 162 which was set by the input to the DAC 160 from the digital control circuit 150 at the DAC input 161. In that condition, the switch 140 is turned on resulting in sufficient first current 116 flowing through it between the first switch contact 141 and the second switch contact 142 that the potential at the first amplifier input 131 (a mirrored second current 117 times the value of the second resistor $R_2$) equals the potential of the DAC output 162 which in turn maintains the predetermined potential across the MEMS capacitor $C_M$.

At the first time $T_1$, the MEMS actuator circuit 100 enters the measurement mode. At that time, the digital control circuit 150 sends a signal at first control output 151 to the switch control contact 143 to turn off the switch 140 and another signal at second control output 152 to the DAC 160 at DAC input 161 to set the potential of the DAC output 162 to a level that will result in discharging the MEMS capacitor $C_M$ to another preselected level. As shown in the upper plot of FIG. 4, the DAC output potential at DAC output 162 makes a step change from a first DAC potential 411 to a lower second DAC potential 412, and the potential across the MEMS capacitor $C_M$ begins to decrease as shown in the middle curve of FIG. 4.

Between the first time $T_1$ and the second time $T_2$, the potential across the MEMS capacitor $C_M$ decays from the preselected focal potential $V_F$ (first capacitor potential level 410) as shown in the central plot of FIG. 4. At second time $T_2$, the charge on the MEMS capacitor $C_M$ decays to second capacitor potential level 420 such that the potential at the interior contact 123 equals the potential at the DAC output 162 at which time the potential at the input (control input 153) to the digital control circuit 150 switches from a logic LOW state to a logic HIGH state as shown in the lower curve of FIG. 4.

The potential across the MEMS capacitor $C_M$ is equal to the potential at the first actuator output 105 referenced to the first potential 171 which in the embodiments of FIGS. 1 and 2 is shown as ground potential GND. The central plot in FIG. 4 is the plot of the potential across the MEMS capacitor $C_M$ as it decays in the measurement mode from the preselected focal potential $V_F$. And, the lower plot in FIG. 4 is the plot of the logic level at the input to the digital control circuit 150 as the potential across the MEMS capacitor $C_M$ decays in the measurement mode from the preselected focal potential $V_F$ during which time the logic level input to the digital control circuit 150 at control input 153 is a logic LOW which is also more generally referred to herein as a first potential level 430. The first time $T_1$ is the time at which the digital control circuit 150 sent a signal to the switch control contact 143 to turn off the switch 140, and the second time $T_2$ is the time at which the digital control circuit 150 detects a change at the control input 153 from a logic LOW state to a logic HIGH state also more generally referred to herein as a second potential level 440 as shown in the lower curve of FIG. 4. The time interval T is equal to $(T_2-T_1)$. An error E in the determination of the value of the time interval T is shown on the lower curve of FIG. 4. The time interval T is equal to $n/f_{OSC}$ where n is the measured number or clock cycles between the second time $T_2$ and the first time $T_1$ and $f_{OSC}$ is the number of cycles per second at which the clock oscillates.

The voltage across MEMS capacitor $C_M$ at time "t" after the measurement mode is entered is given by $$v_C(t) = V_C\left(e^{-\frac{t}{(R_1+R_2)C_M}}\right) \quad \text{(Eq. 1)}$$

where $V_C$ is the pre-charged voltage across the MEMS capacitor $C_M$. For short discharge times, i.e., $t<<(R_1+R_2)C_M$, $v_C(t)$ can be approximated by $$v_C(t) \approx V_C\left(1 - \frac{t}{(R_1+R_2)C_M}\right) \quad \text{(Eq. 2)}$$

If a voltage $V_T$ is placed on the positive input to the operational amplifier for FIG. 1 or on the positive input to the comparator for FIG. 2, $$v_C(T) = V_T \times \frac{(R_1+R_2)}{R_1} = V_C\left(1 - \frac{T}{(R_1+R_2)C_M}\right) \quad \text{(Eq. 3)}$$

where T is the time that the operational amplifier in FIG. 1 or the comparator in FIG. 2 switches state. Solving Equation 3 for the MEMS capacitor $C_M$ results in, $$C_M = \frac{T}{(R_1 + R_2)} \times \frac{1}{1 - \frac{V_T}{V_C} \frac{(R_1 + R_2)}{R_1}} \quad (\text{Eq. 4})$$

Since $$1 - \frac{V_T}{V_C} \frac{(R_1 + R_2)}{R_1} = \frac{V_C - V_T \frac{(R_1 + R_2)}{R_1}}{V_C} \quad (\text{Eq. 5})$$

is the fractional change in the voltage across the MEMS capacitor $C_M$ at the point that the operational amplifier in FIG. 1 or the comparator in FIG. 2 switches state, the quantity on either side of Equation 5 is equal to $$\frac{V_C - V_T \frac{(R_1 + R_2)}{R_1}}{V_C} = \frac{X}{D_n} \quad (\text{Eq. 6})$$

where X is the number of DAC 160 digital increments that $V_T$ is below $V_c \times R_1/(R_1+R_2)$ and $D_n$ is the total number of DAC 160 digital increments for the pre-charged voltage $V_C$ across the MEMS capacitor $C_M$. It follows that $$C_M = \frac{T}{(R_1 + R_2)} \times \frac{X}{D_n} \quad (\text{Eq. 7})$$

Figure 5:
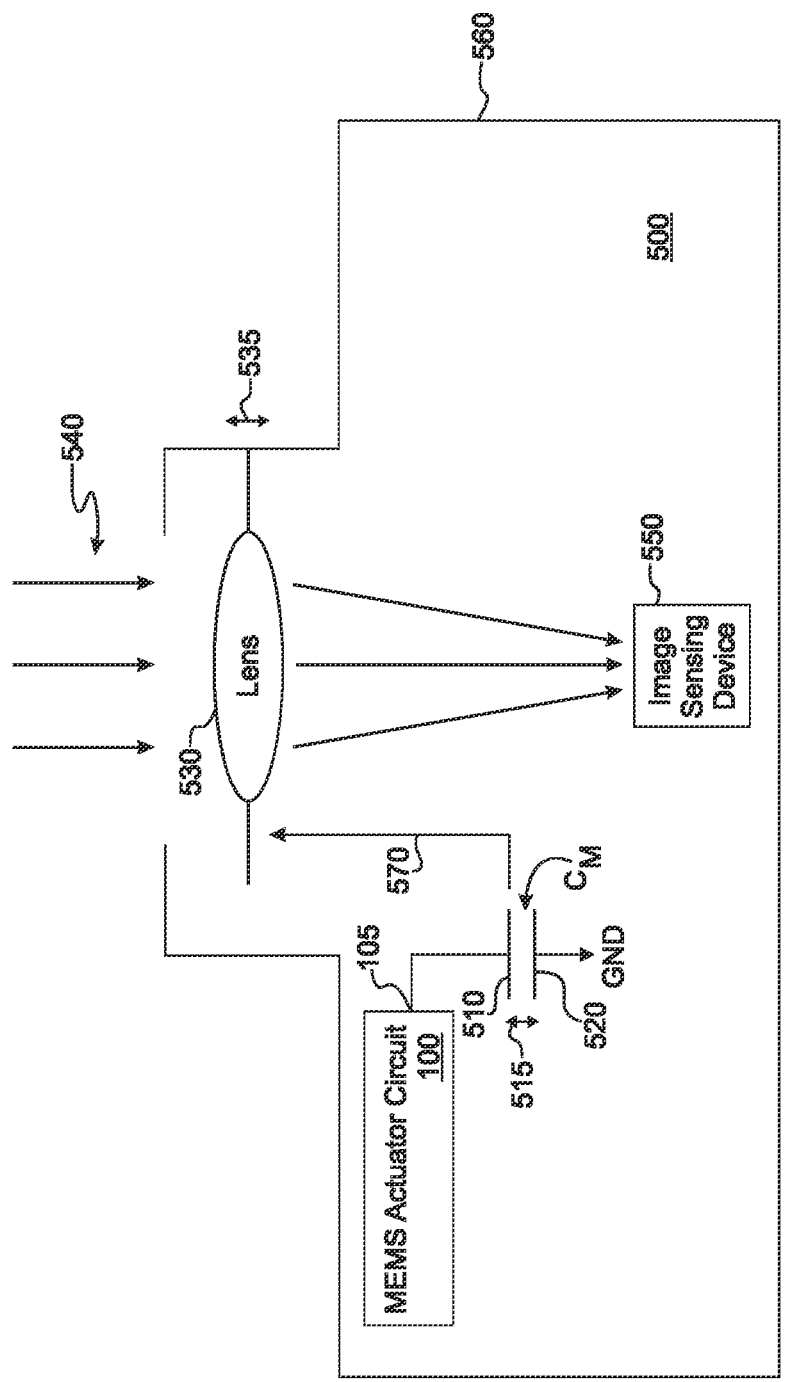
FIG. 5 is a drawing of an image detection system as described in various representative embodiments.

FIG. 5 is a drawing of an image detection system 500 as described in various representative embodiments. The image detection system 500 comprises the MEMS actuator circuit 100, the MEMS capacitor $C_M$, a lens 530, an image sensing device 550, and a case 560. The image sensing device 550 could be, for example, a digital image sensor 550. The image detection system 500 could be, for example, a camera 500, a digital camera 500, a video camera 500, a digital video camera 500, a camcorder 500, a digital camcorder 500, a digital video camcorder 500, or other appropriate system. The MEMS capacitor $C_M$ comprises a movable plate 510 and a fixed plate 520. The fixed plate 520 is fixed in position relative to the image sensing device 550. The movable plate 510 is coupled to the lens 530 as indicated by the single headed arrow 570 such that a change in the location of the movable plate 510 relative to a fixed plate 520 as indicated by the first double headed arrow 515 effects a change in the location of the lens 530 as indicated by the second double headed arrow 535 relative to the image sensing device 550.

Figure 6:
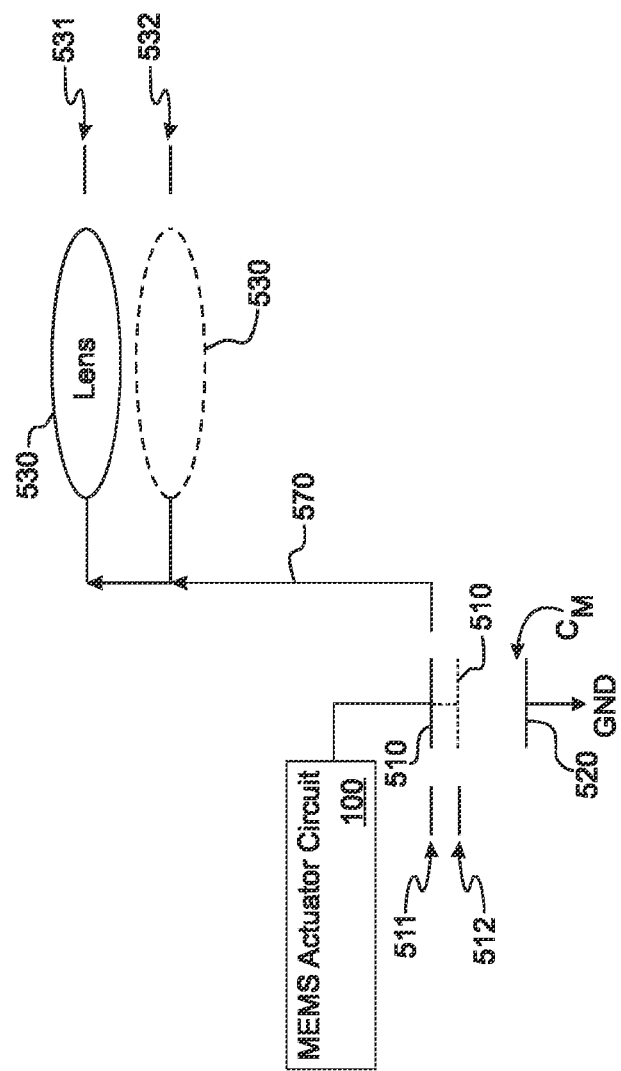
FIG. 6 is a drawing of a part of the image detection system of FIG. 5.

FIG. 6 is a drawing of a part of the image detection system 500 of FIG. 5. The MEMS capacitor $C_M$ comprises two conducting plates on which electrical charge can reside. One plate of the MEMS capacitor $C_M$ is a movable plate 510 and the other plate is a fixed plate 520. The movable plate 510 is coupled to the lens 530 (as indicated in FIG. 5 by the single headed arrow 570) such that a change in the location of the movable plate 510 relative to the fixed plate 520 from a first plate location 511 to a second plate location 512 effects a change in the location of the lens 530 from a first lens location 531 to a second lens location 532. The lens 530 can project an image 540 of an object onto the image sensing device 550. As shown in FIG. 5, the image 540 of the object propagates from the object through the lens 530 and onto the image sensing device 550. The object is not shown in any of the figures. Movement of the movable plate 510 of the MEMS capacitor $C_M$ relative to the fixed plate 520 changes the focal length of the lens 530 which enables bringing the projected image 540 into focus on the image sensing device 550.

In an alternative embodiment, the MEMS actuator circuit 100 of FIG. 1 could be replaced in FIGS. 5 and 6 with the other MEMS actuator circuit 200 of FIG. 2.

While the above representative embodiments have been described in terms of the Metal-Oxide-Semiconductor Field-Effect Transistors (MOSFETs) and other devices shown in FIGS. 1 and 2, it will be understood by one of ordinary skill in the art that other representative embodiments can be implemented using different fabrication technologies and different devices. In particular, with a change in the polarity of the second potential 172 ($V_{CC}$) from positive to negative relative to the first potential 171 (ground potential GND), the two p-channel MOSFETs shown in FIGS. 1 and 2 could be replaced by two n-channel MOSFETs and the n-channel MOSFET shown in FIGS. 1 and 2 could be replaced by a p-channel MOSFET.

In a representative embodiment, a MEMS actuator circuit 100 for on-chip measurement of capacitance is disclosed. The MEMS actuator circuit 100 comprises a current mirror 110 having a first, a second, and a third mirror contacts 111,112, 113, a voltage divider 120 having an interior contact 123 and coupled between the second mirror contact 112 and a first potential 171, an operational amplifier 130 having a first amplifier input 131 coupled to the interior contact 123, a second amplifier input 132, and an amplifier output 133, and a switch 140 having a first switch contact 141 coupled to the first mirror contact 111, a second switch contact 142 coupled to the amplifier output 133, and a switch control contact 143. A first current 116 flowing through the first mirror contact 111 is mirrored by a second current 117 flowing through the second mirror contact 112; a digital to analog converter (DAC) 160 has a DAC input 161 and has a DAC output 162 coupled to the second amplifier input 132; a digital control circuit 150 has a first control output 151 coupled to the switch control contact 143, a second control output 152 coupled to the DAC input 161, and a control input 153 coupled to the amplifier output 133, an enabling signal 180 from the digital control circuit 150 to the switch control contact 143 couples the first and the second switch contacts 141,142 together; and the capacitance of a capacitor $C_M$ coupled between the second mirror contact 112 and the first potential 171 can be determined from a measurement of a time for the potential at the control input 153 to switch from a first potential level 430 to a second potential level 440 following an appropriate change in the DAC output potential 400.

In another representative embodiment, another MEMS actuator circuit 100 for on-chip measurement of capacitance is disclosed. The MEMS actuator circuit 100 comprises a current mirror 110 having a first, a second, and a third mirror contacts 111,112,113, a voltage divider 120 having an interior contact 123 and coupled between the second mirror contact 112 and a first potential 171, an operational amplifier 130 having a first amplifier input 131 coupled to the interior contact 123, a second amplifier input 132, and an amplifier output 133, a comparator 280 having a first comparator input 281 coupled to the first amplifier input 131, a second comparator input 282 coupled to the second amplifier input 132, and a comparator output 283, and a switch 140 having a first switch contact 141 coupled to the first mirror contact 111, a second switch contact 142 coupled to the amplifier output 133, and a switch control contact 143, A first current 116 flowing through the first mirror contact 111 is mirrored by a second current 117 flowing through the second mirror contact 112; a digital to analog converter (DAC) 160 has a DAC input 161 and has a DAC output 162 coupled to the second amplifier input 132 and to the second comparator input 282; a digital control circuit 150 has a first control output 151 coupled to the switch control contact 143, a second control output 152 coupled to the DAC input 161, and a control input 153 coupled to the comparator output 283; an enabling signal 180 from the digital control circuit 150 to the switch control contact 143 couples the first and the second switch contacts 141,142 together; and capacitance of a capacitor $C_M$ coupled between the second mirror contact 112 and the first potential 171 can be determined from a measurement of a time for the potential at the control input 153 to switch from a first potential level 430 to a second potential level 440 following an appropriate change in the DAC output potential 400.

In still another representative embodiment, a method 350 for on-chip measurement of capacitance of a capacitor $C_M$ coupled to a MEMS actuator circuit 100 is disclosed, The method 350 comprises at a first time $T_1$, decoupling the capacitor $C_M$ from a current mirror 110 that pre-charged the capacitor $C_M$ to a preselected potential, at the first time $T_1$, setting the output of a voltage control circuit 160 to a value associated with a smaller absolute potential across the capacitor $C_M$ than that of the preselected potential, discharging the capacitor $C_M$ through a voltage divider 120 until the value of the potential across the capacitor $C_M$ associated with the smaller absolute potential across the capacitor $C_M$ is reached, identifying the time at which the value of the potential across the capacitor $C_M$ associated with the smaller absolute potential across the capacitor $C_M$ is reached as a second time $T_2$ and computing the capacitance of the capacitor $C_m$ using the resistance of the voltage divider 120 and the difference between the second time $T_2$ and the first time $T_1$, The representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. A MEMS actuator circuit, comprising:
   a current mirror having a first, a second, and a third mirror contacts,
      wherein a first current flowing through the first mirror contact is mirrored by a second current flowing through the second mirror contact;
   a voltage divider having an interior contact and coupled between the second mirror contact and a first potential;
   an operational amplifier having a first amplifier input coupled to the interior contact, a second amplifier input, and an amplifier output; and
   a switch having a first switch contact coupled to the first mirror contact, a second switch contact coupled to the amplifier output, and a switch control contact,
      wherein a MEMS capacitor is coupled between the second mirror contact and the first potential,
      wherein one plate of the MEMS capacitor is a movable plate and the other plate is a fixed plate,
      wherein the movable plate is coupled to a lens,
      wherein a change in the location of the movable plate relative to the fixed plate effects a change in the location of the lens, and wherein the lens has capability of projecting an image onto an image sensing device.

2. The MEMS actuator circuit as recited in claim 1, wherein if a second potential at the third mirror contact is positive relative to the first potential, the switch is an n-channel field-effect transistor,
   otherwise if the second potential is negative relative to the first potential, the switch is a p-channel field-effect transistor.

3. The MEMS actuator circuit as recited in claim 1, wherein
   if a second potential at the third mirror contact is positive relative to the first potential, the current mirror comprises two p-channel field-effect transistors,
   otherwise if the second potential is negative relative to the first potential, the current mirror comprises two n-channel field-effect transistors.

4. The MEMS actuator circuit as recited in claim 1, wherein the potential across the MEMS capacitor is pre-charged to a preselected first potential level prior to changing a potential applied to the second amplifier input.

5. The MEMS actuator circuit as recited in claim 1, wherein the image sensing device is a digital image sensor.

6. The MEMS actuator circuit as recited in claim 1, wherein an image detection system comprises the MEMS capacitor, the lens, and the image sensing device and wherein the image detection system is selected from the group consisting of a camera, a digital camera, a video camera, a digital video camera, a camcorder, a digital camcorder, and a digital video camcorder.

7. The MEMS actuator circuit as recited in claim 1, further comprising:
   a digital to analog converter (DAC) having a DAC output coupled to the second amplifier input and having a DAC input; and
   a digital control circuit having a first control output coupled to the switch control contact, a second control output coupled to the DAC input, and a control input coupled to the amplifier output.

8. The MEMS actuator circuit as recited in claim 1, wherein if an enabling signal is applied to the switch control contact and a first potential level is applied to the second amplifier input, the first and the second switch contacts are coupled together and the potential at the second mirror contact is driven to a focal potential
   and wherein if the enabling signal is removed resulting thereby in decoupling of the first and the second switch contacts and a second potential level applied to the second amplifier input, the capacitance of the MEMS capacitor can be determined from a measurement of a time for the potential at the amplifier output to switch from the first potential level to the second potential level.

9. A MEMS actuator circuit, comprising:
   a current mirror having a first, a second, and a third mirror contacts,
      wherein a first current flowing through the first mirror contact is mirrored by a second current flowing through the second mirror contact;
   a voltage divider having an interior contact and coupled between the second mirror contact and a first potential;
   an operational amplifier having a first amplifier input coupled to the interior contact, a second amplifier input, and an amplifier output;
   a comparator having a first comparator input coupled to the first amplifier input, a second comparator input coupled to the second amplifier input, and a comparator output; and a switch having a first switch contact coupled to the first mirror contact, a second switch contact coupled to the amplifier output, and a switch control contact, wherein a MEMS capacitor is coupled between the second mirror contact and the first potential, wherein one plate of the MEMS capacitor is a movable plate and the other plate is a fixed plate, wherein the movable plate is coupled to a lens, wherein a change in the location of the movable plate relative to the fixed plate effects a change in the location of the lens, and wherein the lens has capability of projecting an image onto an image sensing device.

10. The MEMS actuator circuit as recited in claim 9, wherein if a second potential at the third mirror contact is positive relative to the first potential, the switch is an n-channel field-effect transistor, otherwise if the second potential is negative relative to the first potential, the switch is a p-channel field-effect transistor.

11. The MEMS actuator circuit as recited in claim 9, wherein if a second potential at the third mirror contact is positive relative to the first potential, the current mirror comprises two p-channel field-effect transistors, otherwise if the second potential is negative relative to the first potential, the current mirror comprises two n-channel field-effect transistors.

12. The MEMS actuator circuit as recited in claim 9, wherein the potential across the MEMS capacitor is precharged to a preselected first potential level prior to changing a potential applied to the second amplifier input.

13. The MEMS actuator circuit as recited in claim 9, wherein the image sensing device is a digital image sensor.

14. The MEMS actuator circuit as recited in claim 9, wherein an image detection system comprises the MEMS capacitor, the lens, and the image sensing device and wherein the image detection system is selected from the group consisting of a camera, a digital camera, a video camera, a digital video camera, a camcorder, a digital camcorder, and a digital video camcorder.

15. The MEMS actuator circuit as recited in claim 9, further comprising:

a digital to analog converter (DAC) having a DAC output coupled to the second amplifier input and having a DAC input; and a digital control circuit having a first control output coupled to the switch control contact, a second control output coupled to the DAC input, and a control input coupled to the comparator output.

16. The MEMS actuator circuit as recited in claim 9, wherein if an enabling signal is applied to the switch control contact and a first potential level is applied to the second amplifier input, the first and the second switch contacts are coupled together and the potential at the second mirror contact is driven to a focal potential and wherein then if the enabling signal is removed resulting thereby in decoupling of the first and the second switch contacts and a second potential level applied to the second amplifier input, the capacitance of the MEMS capacitor can be determined from a measurement of a time for the potential at the comparator output to switch from the first potential level to the second potential level.

* * * * *